(12) United States Patent
Tastavridis

(10) Patent No.: US 6,538,808 B1
(45) Date of Patent: Mar. 25, 2003

(54) SEMICONDUCTOR OPTICAL AMPLIFIER

(75) Inventor: Kostas Tastavridis, Harlow (GB)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 09/990,713

(22) Filed: Nov. 21, 2001

(51) Int. Cl.[7] ............... H01S 3/18; H01S 3/933; H01S 3/10
(52) U.S. Cl. ............ 359/344; 359/134; 359/160; 359/337; 372/20; 372/38.02; 372/46
(58) Field of Search ............... 359/344, 337, 359/134, 160; 372/20, 38.02, 38.05, 46, 87

(56) References Cited

U.S. PATENT DOCUMENTS

| | | | | |
|---|---|---|---|---|
| 5,436,759 A | * | 7/1995 | Dijaili et al. | 359/333 |
| 5,604,628 A | * | 2/1997 | Parker et al. | 359/344 |
| 5,748,653 A | * | 5/1998 | Parker et al. | 372/8 |
| 6,331,990 B1 | * | 12/2001 | Parker et al. | 372/8 |
| 6,339,496 B1 | * | 1/2002 | Koley et al. | 359/344 |
| 6,347,104 B1 | * | 2/2002 | Dijaili et al. | 372/38.01 |
| 6,445,495 B1 | * | 9/2002 | Walker et al. | 359/344 |
| 6,459,709 B1 | * | 10/2002 | Lo et al. | 372/20 |
| 2002/0090013 A1 | * | 7/2002 | Murry et al. | 372/36 |

OTHER PUBLICATIONS

'A Single–Chip Linear Optical Amplifier'—D.A. Francis, S.P.DiJalli, J.D. Walker, Genoa Corporation. PD13 pp. 1 to 3.

* cited by examiner

Primary Examiner—Nelson Moskowitz
(74) Attorney, Agent, or Firm—Barnes & Thornburg

(57) ABSTRACT

Semiconductor optical amplifiers (SOAs) are cheaper to manufacture, control and test than other types of optical amplifier such as erbium doped fiber amplifiers (EDFAs). However, SOAs are non-linear in the respect that the gain of an SOA is not constant for different input or output signal powers. This is a significant problem because cross-talk between channels occurs as a result. It is known that the gain of SOAs can be clamped by integrating a vertical cavity surface emitting laser (VCSEL) with the SOA such that their active regions are shared. The present invention enables the physical length of such devices to be increased in such a manner that the saturation output power is increased whist retaining the gain clamping effect. This is achieved by using two or more contact points on the device at which different drive currents are applied.

14 Claims, 3 Drawing Sheets

SEMICONDUCTOR OPTICAL AMPLIFIER

FIELD OF THE INVENTION

The present invention relates to semiconductor optical amplifiers (SOAs) and in particular to linear optical amplifiers of the type formed by integrating an amplifier and a vertical cavity surface emitting laser (VCSEL).

BACKGROUND TO THE INVENTION

Linear optical amplifiers of the type formed by integrating an amplifier and a VCSEL have been developed by Genoa Corporation and are described in their paper "A single-chip linear optical amplifier" by D. A. Francis, S. P. DiJaili and J. D. Walker (Optical Fibre Communications Conference, 17–22 March 2001, Anaheim, Calif., USA, paper PD13) which is incorporated herein by reference. The present invention builds on and extends the work described in that paper.

Optical communications networks use optical amplifiers as is well known in the art to increase the power of optical signals. As optical communications networks develop, increasing demands are required of such optical amplifiers in order that they can operate with increased data rates, in multi-wavelength environments, are smaller and can be easily integrated with other optical equipment and devices.

Existing optical amplifiers are problematic in many of these respects. For example erbium doped fibre amplifiers (EDFAs) are relatively expensive to manufacture, control and test because they contain many active and passive components. They also have a relatively large footprint. Semiconductor optical amplifiers avoid some of these problems, being smaller in size and less expensive to manufacture. However, they are non-liner and as a result cross-talk between channels occurs which is undesirable. Genoa Corporation address this problem of non-linearity by integrating a VCSEL into an SOA on an Indium Phosphide (InP) substrate. This is described in more detail below in the section headed SOA with Integrated VCSEL. However, the device proposed by Genoa Corporation is not suited for operation at speeds above 10 Gbps such as at speeds of 40 Gbps. In addition the saturation output power of the Genoa device is at around 8 dbm. However, for many applications, higher output powers of around 12 to 14 dbm and above are required.

OBJECT OF THE INVENTION

An object of the present invention is to provide a semiconductor optical amplifier with integrated VCSEL that addresses or at least mitigates one or more of the problems noted above.

Further benefits and advantages of the invention will become apparent from a consideration of the following detailed description given with reference to the accompanying drawings, which specify and show preferred embodiments of the invention.

SUMMARY OF THE INVENTION

Semiconductor optical amplifiers (SOAs) are cheaper to manufacture, control and test than other types of optical amplifier such as erbium doped fibre amplifiers (EDFAs). However, SOAs are non-linear in the respect that the gain of an SOA is not constant for different input or output signal powers. This is a significant problem because cross-talk between channels occurs as a result. It is known that the gain of SOAs can be clamped by integrating a vertical cavity surface emitting lasr (VCSEL) with the SOA such that their active regions are shared. The present invention enables the physical length of such devices to be increased in such a manner that the saturation output power is increased whilst retaining the gain clamping effect. This is achieved by using two or more contact points on the device at which different drive currents are applied.

According to a first aspect of the present invention there is provided a semiconductor optical amplifier comprising:
  a vertical cavity surface emitting laser (VCSEL) integrated with the semiconductor optical amplifier such that the active regions of those devices are shared;
  two or more electrical contacts provided on the semiconductor optical amplifier and arranged such that an electrical current may be applied to those contacts in use such that power is applied to the VCSEL.

This provides the advantage that the range of input or output signal powers for which the gain of the SOA remains constant is increased. By using two or more contacts to add drive current to the VCSEL this is achieved. In addition the saturation output power of the SOA is increased. Preferably the amount of drive current applied at a particular one of the contacts is related to the position of the contact along the semiconductor optical amplifier. That is, larger drive currents are applied to contacts further along the length of the SOA in the direction of propagation of an optical signal through the SOA in use.

Preferably the semiconductor optical amplifier further comprises an electrically conducting layer which is separated into two or more regions by one or more electrically insulating areas and wherein each of said electrical contacts is provided on a different one of said regions. For example the electrically conducting layer can be a metallic layer applied to the surface of the SOA and into which a groove is etched between the two contacts in order to separate/isolate them from each other. This provides a simple and cost effective way in which the device can be manufactured.

Preferably the semiconductor optical amplifier has a length greater than about 1 mm. This provides the advantage that devices suitable for operation at high signal speeds are created.

Advantageously, the semiconductor optical amplifier is suitable for operation at signal speeds of greater than 10 Gbps and to have a signal output power of greater than 12 dbm.

According to another aspect of the present invention there is provided a method of amplifying an optical signal comprising the steps of:
  passing the signal through a waveguide in a semiconductor optical amplifier with an integrated vertical cavity surface emitting laser (VCSEL); and
  applying a current at two or more points along the semiconductor optical amplifier such that said current provides power to the VCSEL.

The preferred features may be combined as appropriate, as would be apparent to a skilled person, and may be combined with any of the aspects of the invention.

BRIEF DESCRIPTION OF THE DRAWINGS

In order to show how the invention may be carried into effect, embodiments of the invention are now described below by way of example only and with reference to the accompanying figures in which.

DETAILED DESCRIPTION OF INVENTION

Embodiments of the present invention are described below by way of example only. These examples represent the best ways of putting the invention into practice that are currently known to the Applicant although they are not the only ways in which this could be achieved.

SOA with Integrated VCSEL

Figure 1:
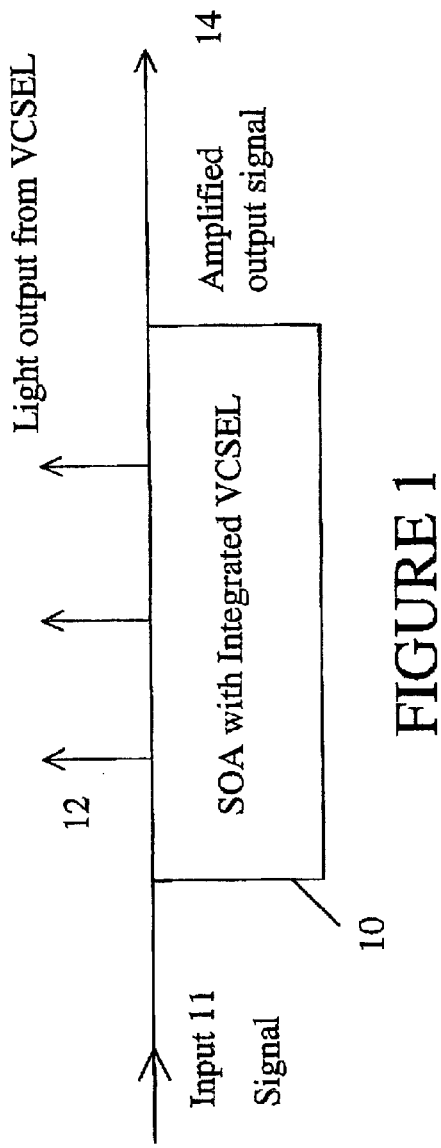
FIG. 1 is a schematic diagram of a semiconductor optical amplifier with integrated VCSEL according to the prior art.
Figure 4A:
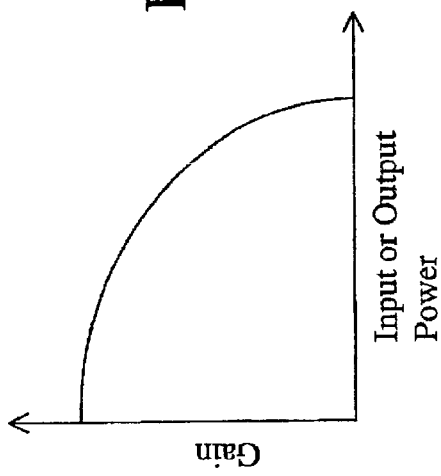
FIG. 4a is a schematic graph of gain against output power for an SOA with no integrated VCSEL.

As mentioned above SOAs are non-linear. That is, the gain provided by the SOA is not constant for different signal powers. This is illustrated in FIG. 4a where it can be seen that the gain of the SOA drops as the signal input or output power increases. Genoa Corporation address this problem by integrating a VCSEL with the SOA. That is, the VCSEL and the amplifier are arranged to share the same active region such that the VCSEL acts along the whole length of the amplifier. The VCSEL has high reflectivity mirrors positioned above and below the active region and is arranged to provide lasing action perpendicular to the direction of travel of the light signal. This is illustrated in FIG. 1 which shows a device 10 comprising an SOA with integrated VCSEL. An input signal 11 comprising for example a series of light pulses, enters the device 10 via an input fibre. The input signal is amplified as it travels along the device 10 as a result of the action of the SOA. In addition the VCSEL acts on the signal with a lasing action in a direction perpendicular to the direction of travel of the signal. As a result of this lasing action light is emitted from the device as indicated by arrows 12 in FIG. 1. The VCSEL acts to clamp the gain produced by the SOA such that the gain remains substantially constant for a range of input or output signal power levels. The amplified output signal 14 exits the device 10 via an output fibre as indicated in FIG. 1.

The SOA is a travelling wave optical amplifier that acts to amplify the signal during a single pass as is known in the art. In addition, the lasing action of the VCSEL enables photons to be added to the signal as it travels along the device 10 and this produces the gain clamping effect. That is, some of the radiation emitted by the VCSEL in the direction perpendicular to the signal, is taken into the signal and acts as a ballast to ensure that the gain is clamped. This process is explained in more detail in the paper "A single-chip linear optical amplifier" mentioned above, in which Genoa Corporation describe achieving a constant gain of 17 dB for a signal output power from −8 to 12 dBm. This was found for a device of size 1 mm×0.5 mm×0.5 mm, with a VCSEL threshold current of about 100 mA and an operating current of around 200 to 300 mA. The amplifier operated across the C-band (1530–1565 nm) and the device was formed using a standard manufacturing process. Signals at 10 Gbps were used.

Figure 2:
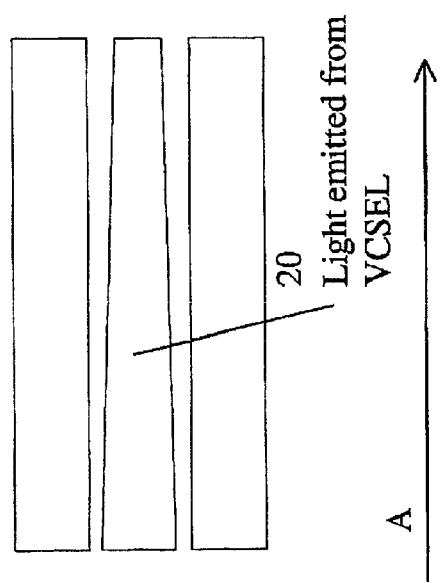
FIG. 2 is a schematic plan view of the device of FIG. 1 showing laser light emitted from the optical amplifier.

FIG. 2 is a schematic plan view of the device 10 of FIG. 1 in use. It shows light 20 emitted from the top of the device 10 as a result of the lasing action of the VCSEL. The present invention recognises that the intensity of this emitted light becomes weaker in the direction indicated by the arrow A which is the propagation axis of the SOA.

The present invention recognises that this light emitted by the VCSEL becomes weaker along the propagation axis because photons from the lasing action of the VCSEL are converted into the signal propagating in the amplifier. This affects the lasing condition of the VCSEL and eventually the clamping action of the VCSEL on the gain of the device is lost. As more and more of the photons from the VCSEL action are converted into the signal the VCSEL eventually stops lasing and effectively switches off. The gain experienced by the signal is then destabilised.

For these reasons the device proposed by Genoa Corporation in their paper mentioned above is not suited for operation at speeds significantly greater than 10 Gbps because longer devices are required for operation at higher speeds. The longer the device 10 of FIG. 1 becomes the greater the propagation distance for the signal in the device and the more likely that the VCSEL action will be lost for the reasons described above. In addition the saturation output power of the device described in Genoa's paper is only around 8 to 12 dBm.

The present Invention addresses these problems by providing additional power/drive current to the VCSEL at two or more contact points along the length of the device. These contact points are preferably created by etching one or more grooves in a metallic contact region on the surface of the device. However this is not essential, any suitable means by which two or more contacts are provided can be used.

Figure 3:
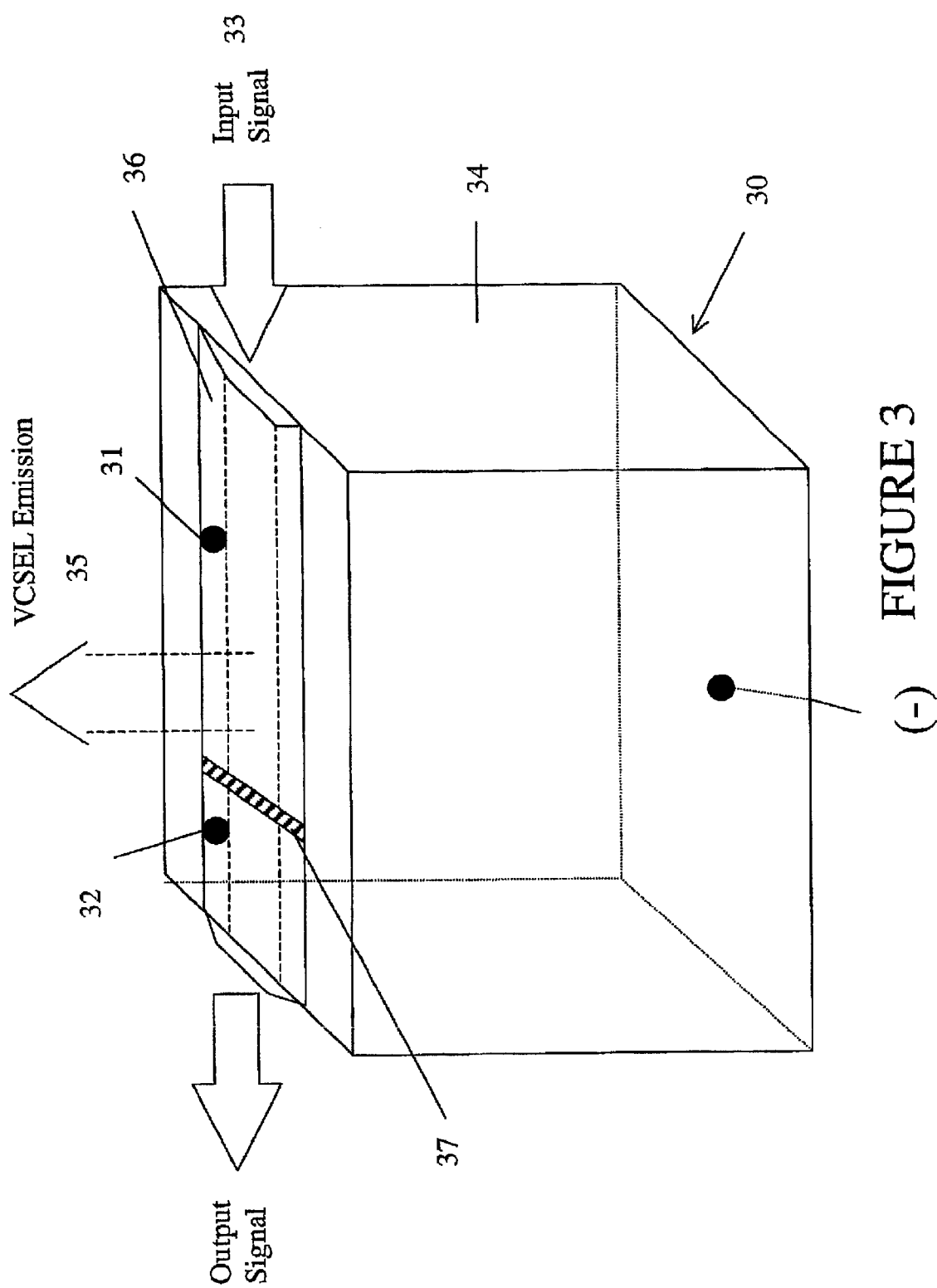
FIG. 3 is a schematic diagram of a semiconductor optical amplifier with integrated VCSEL according to an embodiment of the present invention.

This is illustrated schematically in FIG. 3 which shows a device 30 comprising an SOA with integrated VCSEL similar to the device 10 of FIG. 1 but with two contacts 31, 32. The device 30 is supported on a substrate which is at ground potential and an input signal 33 is shown entering the device. The signal propagates along the active region of the semiconductor material 34 forming the device and is amplified by the action of the SOA. The VCSEL also acts on the signal as described above and VCSEL emissions 35 occur in a direction perpendicular to the signal as indicated. A metallic layer 36 is provided on the upper surface of the device 30 running along the length of the device and covering at least part of the surface of the device. A groove 37 is etched in this metallic surface such that two regions of the metallic layer are formed. A first contact 31 is made on one of these regions and an electric current applied using a suitable power source as is known in the art. This acts to produce more carriers in the active region and makes more photons available enabling the gain to be clamped effectively by the VCSEL. The same is done using a second contact 32 in the second region of the metallic layer. By using two or more contacts in this way the length of the device 30 can be extended such that the device is suitable for operation at high speeds. Preferably a larger current is applied at the second contact 32 than at the first contact 31. That is, larger drive currents are applied at contacts located further along propagation axis of the SOA. Better clamping of the SOA gain of the device is achieved and the range of output powers for which the gain of the device is constant is increased. The saturation output power being the highest output power at which the constant gain is mentioned. This is illustrated in FIG. 4b.

Figure 4B:
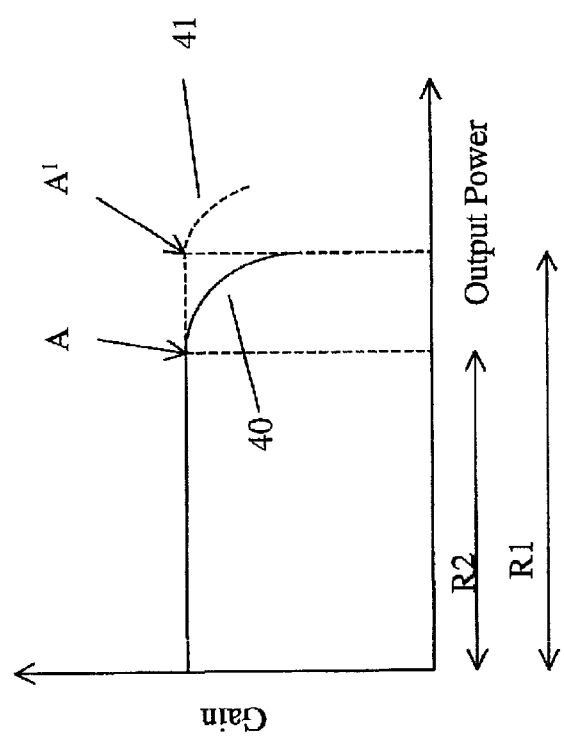
FIG. 4b is a schematic graph of gain against output power for the devices of FIGS. 1 and 3.

FIG. 4b is a schematic graph of gain against output power for the devices of FIG. 1 (see line 40 of FIG. 4b) and FIG. 3 (see line 41 of FIG. 4b). It can be seen that the range of output powers for which constant gain is achieved is greater for the device of FIG. 3 (see R1) than for the device of FIG. 1 (R2). In addition the saturation output power (see points A and A') is higher for the device of FIG. 3 (point A') than it is for the device of FIG. 1 (point A).

This is explained further with reference to the rate equation below:

$$\frac{dI^{(s)}}{dz} = \Gamma A^{(s)} \frac{\tau J/ed + (\tau A^{(p)}/h\nu) N_a^{(p)} I^{(p)} - N_a^{(s)}}{1 + I^{(s)}/I_o^{(s)}} I^{(s)} \quad (1)$$

Where $\Gamma$ is the confinement factor, $A^{(s),(p)}$ are the differential gain coefficients for the signal and the pump lights, $N_a^{(s),(p)}$ are the carrier densities at transparent for signal and pump lights, J is the injection current, d is the wave-guide thickness, $I^{(s),(p)}$ are the light intensities for signal and pump lights, and $\tau$ is the gain recovery time given by:

$$\frac{1}{\tau} = \frac{1}{\tau_c} + \frac{A^{(p)} I^{(p)}}{h\nu} \quad (2)$$

where $\tau_c$ is the carrier lifetime.

The term pump light is used to refer to light emitted from the VCSEL. The injection current J refers to the drive current input at one of the contacts (31 or 32).

From the equations above it can be seen that the saturation output power $I^{(s)}$ is inversely proportional to the gain recovery time $\tau$ of the amplifier. The present invention enables the gain recovery time to be reduced by injecting more photon density into the amplifier. This then leads to an increase in the saturation output power.

The multiple contacts offer the flexibility of applying an extra amount of drive current at the sections of the SOA where the VCSEL emission (pump light) has been reduced. The extra current results in an increase of the VCSEL emitted light, hence an increase of the saturation output power of the SOA according to the equation 1 and stabilizes the SOA gain for longer lengths along the device.

The term "light" is used herein to refer to electromagnetic radiation which may or may not be in the range of the electromagnetic spectrum which is visible to humans.

Any range or device value given herein may be extended or altered without losing the effect sought, as will be apparent to the skilled person for an understanding of the teachings herein.

What is claimed is:

1. A semiconductor optical amplifier comprising:
   (i) a vertical cavity surface emitting laser (VCSEL) integrated with the semiconductor optical amplifier such that the active regions of those devices are shared;
   (ii) two or more electrical contacts provided on the semiconductor optical amplifier and arranged such that an electrical current may be applied to those contacts in use such that power is applied to the VCSEL.

2. A semiconductor optical amplifier as claimed in claim 1 which further comprises an electrically conducting layer which is separated into two or more regions by one or more electrically insulating areas and wherein each of said electrical contacts is provided on a different one of said regions.

3. A semiconductor optical amplifier as claimed in claim 2 wherein said electrically conducting layer comprises a metallic layer on at least part of the surface of the semiconductor optical amplifier.

4. A semiconductor optical amplifier as claimed in claim 2 wherein said electrically insulating area is a groove.

5. A semiconductor optical amplifier as claimed in claim 1 wherein the electrical current applied to the contacts is sufficient to power the VCSEL such that lasing occurs within the VCSEL in use and as a result of that lasing, the gain of the semiconductor optical amplifier is clamped.

6. A semiconductor optical amplifier as claimed in claim 1 whose length is greater than about 1 mm.

7. A semiconductor optical amplifier as claimed in claim 1 which is suitable for operation at signal speeds of greater than 10 Gbps.

8. A semiconductor optical amplifier as claimed in claim 1 which is arranged to provide a signal output power of greater than 12 dbm.

9. A method of amplifying an optical signal comprising the steps of:
   (i) passing the signal through a waveguide in a semiconductor optical amplifier with an integrated vertical cavity surface emitting laser (VCSEL); and
   (ii) applying a current at two or more points along the semiconductor optical amplifier such that said current provides power to the VCSEL.

10. A method as claimed in claim 9 wherein said two or more points are separated by an electrically insulating region.

11. A method as claimed in claim 9 wherein said two or more points are electrical contacts positioned in a layer above the DBR stack/waveguide.

12. A method as claimed in claim 9 which further comprises outputting a signal from the semiconductor optical amplifier, the output power of said signal being greater than 12 dbm.

13. A method as claimed in claim 9 wherein the speed of said signal is greater than 10 Gbps.

14. An optical transmission system comprising a semiconductor optical amplifier as claimed in claim 1.

* * * * *